United States Patent
Beasom

(10) Patent No.: US 6,552,392 B2
(45) Date of Patent: Apr. 22, 2003

(54) MOS INTEGRATED CIRCUIT WITH REDUCED ON RESISTANCE

(75) Inventor: James D. Beasom, Melbourne Village, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/899,332

(22) Filed: Jul. 3, 2001

(65) Prior Publication Data

US 2003/0006482 A1 Jan. 9, 2003

(51) Int. Cl.[7] .......................... H01L 29/76; H01L 29/94; H01L 31/062; H01L 31/113; H01L 31/119
(52) U.S. Cl. ........................ 257/342; 257/327; 257/335; 257/343
(58) Field of Search .................................. 257/327, 329, 257/335, 342, 343

(56) References Cited

U.S. PATENT DOCUMENTS

| | | |
|---|---|---|
| 4,823,173 A | 4/1989 | Beasom |
| 5,091,336 A | 2/1992 | Beasom |
| 5,264,719 A | 11/1993 | Beasom |
| 5,294,824 A * | 3/1994 | Okada .................. 257/409 |
| 5,430,316 A * | 7/1995 | Contiero et al. ............ 257/335 |
| 5,777,362 A | 7/1998 | Pearce |
| 5,817,564 A | 10/1998 | Church et al. |
| 6,211,552 B1 * | 4/2002 | Efland et al. ................ 257/343 |
| 6,455,892 B1 * | 9/2002 | Okuno et al. ................ 257/328 |

* cited by examiner

*Primary Examiner*—Edward Wojciechowicz
*Assistant Examiner*—Jesse A. Fenty
(74) *Attorney, Agent, or Firm*—Fogg and Associates, LLC; Scott V. Lundberg

(57) ABSTRACT

An integrated circuit having a high voltage lateral MOS with reduced ON resistance. In one embodiment, the integrated circuit includes a high voltage lateral MOS with an island formed in a substrate, a source, a gate and a first and second drain extension. The island is doped with a low density first conductivity type. The source and drain contact are both doped with a high density second conductivity type. The first drain extension is of the second conductivity type and extends laterally from under the gate past the drain contact. The second drain extension is of the second conductivity type and extends laterally from under the gate toward the source. A portion of the second drain extension overlaps the first drain extension under the gate to form a region of increased doping of the second conductivity type.

24 Claims, 8 Drawing Sheets

MOS INTEGRATED CIRCUIT WITH REDUCED ON RESISTANCE

TECHNICAL FIELD

The present invention relates generally to integrated circuits and in particular the present invention relates to an integrated circuit having a MOS structure with reduced ON resistance.

BACKGROUND

Integrated circuits incorporate complex electrical components into a single device. Generally, an integrated circuit comprises a substrate upon which a variety of circuit components are formed wherein each of the circuit components are electrically isolated from each other. For example, the components may include bipolar junction transistors, field effect transistors, etc. Traditionally, integrated circuits found particular application with logic devices and other control circuits that operate at generally low voltages.

Semiconductor material used to make integrated circuits is also effective for handling very high voltages and very high currents. However, traditional high voltage devices are undesired in integrated circuits because the current for their operation generally flows vertically through the substrate to a contact located on the back of the substrate. This design makes it difficult to effectively isolate other devices in the substrate from the high voltage vertical device. These devices are referred to as high voltage vertical devices because the current flows vertically.

More recently, high voltage lateral devices have been developed that are incorporated in integrated circuits. Generally, these high voltage devices are known as lateral devices. A lateral device indicates a device in which the current generally flows horizontal to, or lateral to the device instead of vertical. A high voltage lateral device can be effectively isolated from other circuits or devices in an integrated circuit.

As stated above, integrated circuits are made of semiconductor material. Semiconductor material is material that has a resistance that lies between that of a conductor and an insulator. A common type of semiconductor is the metal-oxide semiconductor (MOS). Semiconductor material is used to make electrical devices that exploit its resistive properties. One common type of semiconductor material is a N-type. N-type semiconductor material is doped with a donor type impurity that generally conducts current via electrons. Another common type of semiconductor material is a P-type. P-type semiconductor material is doped with an acceptor-type impurity that conducts current mainly via hole migration. An example of an electrical device that uses semiconductor material is a transistor. A transistor is a device used to amplify a signal or open and close a circuit. A typical transistor comprises a substrate having layers of varying semiconductor materials that form a source, a drain and a gate. An integrated circuit may comprise a plurality of transistors created from a single substrate to form a circuit.

In a typical semiconductor device constructed as a transistor, the gate typically overlaps a heavily doped drain contact. This results in a high field region where breakdown occurs at relatively low voltages. Breakdown is the failure of the device to perform as designed (i.e. the failure of an isolating region to prevent conduction). Typically, breakdown of a semiconductor transistor occurs at a body/drain junction (when the device is not limited by punch through). To obtain higher break down voltages, double diffused structures are used. Typically, semiconductor devices incorporating double diffused structures have a diffused body (P type for a N type channel) formed in a lightly doped region adjacent to the gate, using the gate edge as a mask. A diffused source is then formed in the body also using the gate edge as part of the mask. The body surface doping sets the threshold voltage. The relatively heavy doping of the body compared to the lightly doped region in which it is formed prevents punch through from drain to source. This allows a higher voltage to be applied to the device before breakdown is reached. An example of a double diffused MOS structure is the double diffused metal-oxide semiconductor (DMOS).

A high voltage lateral MOS structure may incorporate a drain extension as is described in U.S. Pat. Nos. 5,264,719 and 4,823,173. U.S. Pat. Nos. 5,264,719 and 4,823,173 are incorporated herein by reference. The purpose of a drain extension, in general, is to increase breakdown voltage. The drain extension has the effect of decoupling the heavily doped drain contact from a drain edge of an associated gate thereby increasing breakdown voltage. Moreover, under reverse bias conditions, the entire drain extension depletes before electric fields get high enough to cause breakdown. In devices as those disclosed in U.S. Pat. Nos. 5,264,719 and 4,823,173, an ON resistance is encountered in the current path when the device has an activated gate. Generally, the ON resistance consists of the resistance in a channel region under the gate and in the drain extension. Typically, the resistance in the drain extension is the largest term. Generally, the size of the device has a relationship to the ON resistance level. A lower ON resistance per unit area allows the use of smaller dies with reduced costs. Therefore, it is desired, in some high voltage applications, to reduce the ON resistance.

For the reasons stated above and for other reasons stated below which will become apparent to those skilled in the art upon reading and understanding the present specification, there is a need in the art for an integrated circuit having a DMOS structure with a reduced ON resistance.

SUMMARY

The above-mentioned problems with high voltage MOS structures and other problems are addressed by the present invention and will be understood by reading and studying the following specification.

In one embodiment, an integrated circuit having a high voltage lateral MOS is disclosed. The high voltage lateral MOS includes a substrate, a top layer of oxide, a island, a drain contact, a source, a gate and a first and second drain extension. The top layer has a first aperture and a second aperture. The first aperture is laterally spaced a predetermined distance from the second aperture. The island is formed in the substrate and is doped with a low density first conductivity type. In addition, the island is positioned between the top layer and the substrate. The drain contact is formed in the island adjacent the first aperture in the top layer and is doped with a high density second conductivity type. The source is formed in the island adjacent the second aperture in the top layer and is doped with a high density second conductivity type. The gate is positioned under the top layer adjacent the P-island and between the source and the drain contact. The first drain extension is of the second conductivity type and is formed in the island. Moreover, the first drain extension is positioned adjacent the top layer extending laterally from under the gate past the drain contact. The first drain extension is positioned around the drain contact. The second drain extension is of the second conductivity type and is also formed in the island. The second drain extension is positioned adjacent the top layer extending laterally from under the gate toward the source. A portion of the second drain extension overlaps the first drain extension under the gate to form a region of increased doping of the second conductivity type.

In another embodiment, an integrated circuit having a high voltage lateral DMOS is disclosed. The high voltage lateral DMOS includes a substrate, a top layer of oxide. A P– island, a N+ drain contact, a N+ source, a gate and first and second N type drain extensions. The top layer has a first aperture and a second aperture. The first aperture is laterally spaced a predetermined distance from the second aperture. The P– island is formed in the substrate. Moreover, the P– island is positioned between the top layer and the substrate. The N+ drain contact is formed in the P– island adjacent the first aperture of the top layer. The N+ source is formed in the P– island adjacent the top layer. At least a portion of the N+ source is positioned adjacent the second aperture of the top layer. The gate is formed in the top layer adjacent the P– island. The gate is further positioned between the N+ source and the N+ drain contact. The first drain extension is formed in the P– island and is positioned adjacent the top layer extending laterally from under the gate past the drain contact. Moreover, the first drain extension is positioned around the drain contact. The N type second drain extension is formed in the P– island and is positioned adjacent the top layer extending laterally under the gate toward the N+ source. A portion of the second drain extension overlaps the first drain extension under the gate to form a region of increased N type doping.

In another embodiment, an integrated circuit having a plurality of high voltage lateral MOS structures includes a substrate, an island, a plurality of source strips, a plurality of drain strips, a plurality of gate strips and a plurality of island contacts. The island has a low density of a first conductivity type and is formed in the substrate. Each source strip is doped with a high density of a second conductivity type and is formed in the island. Each drain strip is doped with a high density of the second conductivity type and is formed in the P– island. The plurality of source and drain strips are positioned parallel to each other forming a pattern of alternating source and drain strips in the P– island. Each gate strip is positioned adjacent an associated side of a source strip. Each of the plurality of island contacts has a high density of the first conductivity type and is formed in the island. Moreover, each island contact is positioned proximate an end of an associated source channel.

In another embodiment, a method of making an integrated circuit having a high voltage lateral MOS is disclosed. The method comprises introducing a low density impurity of a first conductivity type to a substrate to form an island region, introducing a high density impurity of a second conductivity type in the island region to form a drain contact, introducing a high density impurity of the second conductivity type in the island region to form a source, wherein the source is formed a predetermined lateral distance from the drain, forming a gate on a surface of the island region, wherein the gate is positioned between the drain contact and the source, introducing the second conductivity type impurity in the island region to form a first drain extension, wherein the first drain extension extends laterally from the drain contact to underneath a portion of the gate, further wherein the drain contact is isolated from the island region, and introducing the second conductivity type impurity in the island region to form a second drain extension, wherein the second drain extension extends laterally from a position proximate the source to overlap the first drain extension underneath the gate.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention relate to integrated circuits having a lateral MOS structure. More specifically, embodiments of the present invention relate to integrated circuits having a MOS structure with reduced ON resistance. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate. Before a detailed discussion of the embodiments of the present invention are described, further background is first provided to aid in the understanding of the embodiments of the present invention.

Figure 1:
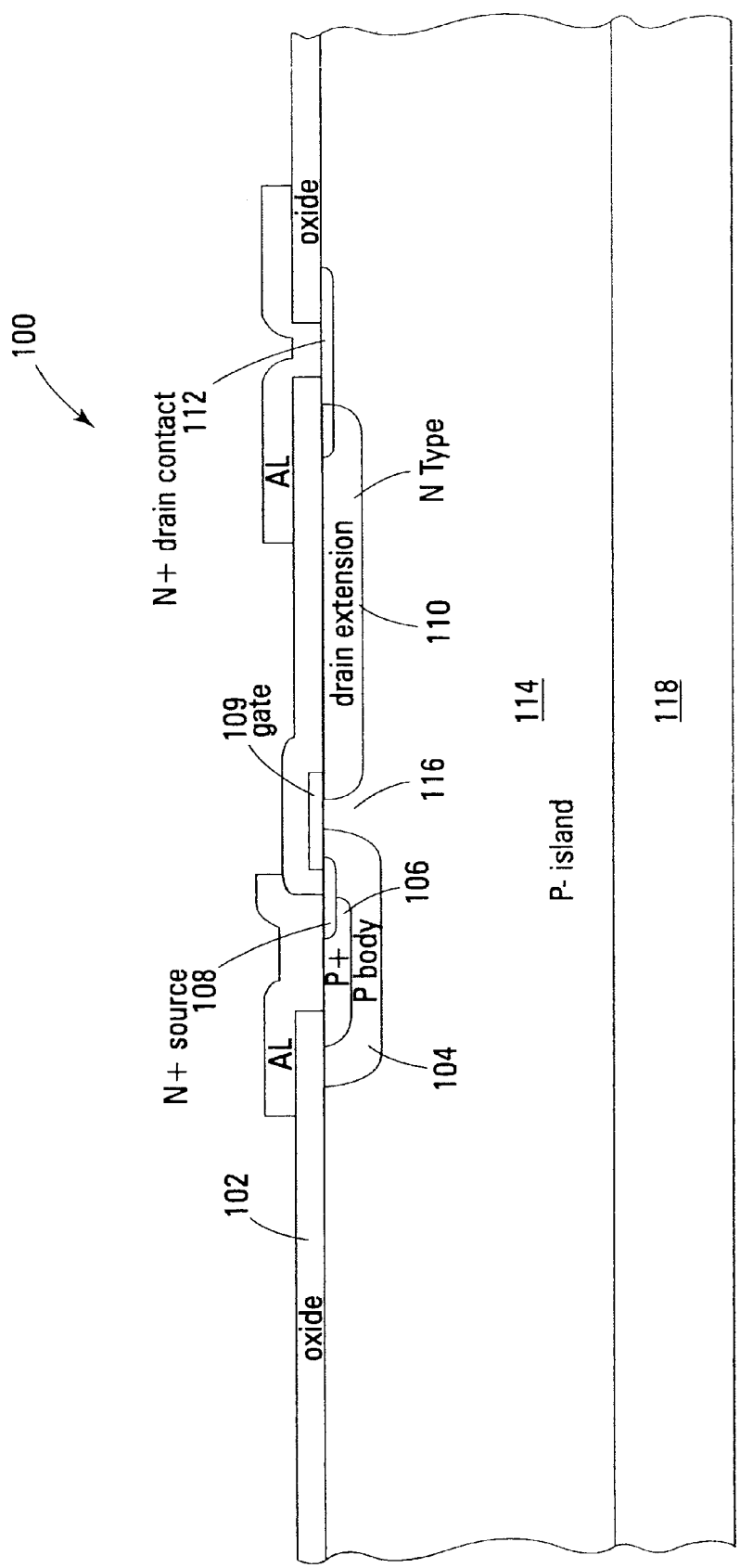
FIG. 1 is a cross-sectional view of a known lateral MOS structure.

Referring to FIG. 1, a cross-sectional view of a known lateral MOS device 100 having a drain extension is shown.

As shown, the device 100 is formed from a substrate 118 of an integrated circuit. The device 100 has a P– island structure or region 114. The designation "P–" indicates P type semiconductor material having a low density or low acceptor density. The P– island 114 has a channel region 116. The device 100 also has a P body 104 formed in the P– island 114. A P+ area 106 is formed in the P body 104. The designation "P+" indicates P type semiconductor material having a high acceptor density. Further, the device 100 is shown having a N+ source 108, a gate 109 and a N+ drain contact 112. The designation "N+" indicates N type semiconductor material having high density or high donor density. Moreover, the device 100 is shown having an oxide layer 102 (dielectric layer). A N type drain extension 110 extends from the N+ drain contact 112 to the gate 109 to increase breakdown voltage. Although not shown, it will be understood in the art that a thin gate dielectric or insulator, in the range of 200–1000 Å, is typically positioned between the gate 109 and the P– island 114.

More specifically, the lateral MOS device shown in FIG. 1, is a DMOS device. The P body 104, defined in part by the edge of gate 109, is formed in the lightly doped P– island 114. Moreover, the N+ source 108 is also defined in part by the edge of the gate 109. Under reverse bias conditions, the depletion layer spreads mostly in the lightly doped drain extension 110 and the lightly doped P– island 114. The heaver doped P body 104 limits the extent of the depletion spread toward the N+ source 108 thereby preventing punch through breakdown. In particular, the DMOS device of FIG. 1 has an asymmetric break down where the drain to source break down is relatively large while the source to drain break down is relatively small.

Current in the lateral MOS device illustrated in FIG. 1, flows along a surface inversion channel from an edge of the source across the P body 104 and the channel region 116 of the P– island 114 to the drain extension 110. The current then enters the drain extension 110 and spreads out across the entire cross section and laterally to the drain contact 112 where it goes out of the device 100. It has been discovered, that the ON resistance of this device, in a voltage range from approximately 200 to 500 volts, can be expressed by the following equation: ON resistance=(R1+A*L)/W. Wherein, W is the width of the channel 116, A is a constant set by doping profiles, L is the length of drain extension 110 and R1 is the link resistance from the channel 116 into the drain extension 110 and from the drain extension 110 to the drain contact 112. R1 also includes channel resistance. Embodiments of the present invention reduce the ON resistance without degrading the breakdown voltage of the device by reducing R1.

Figure 2:
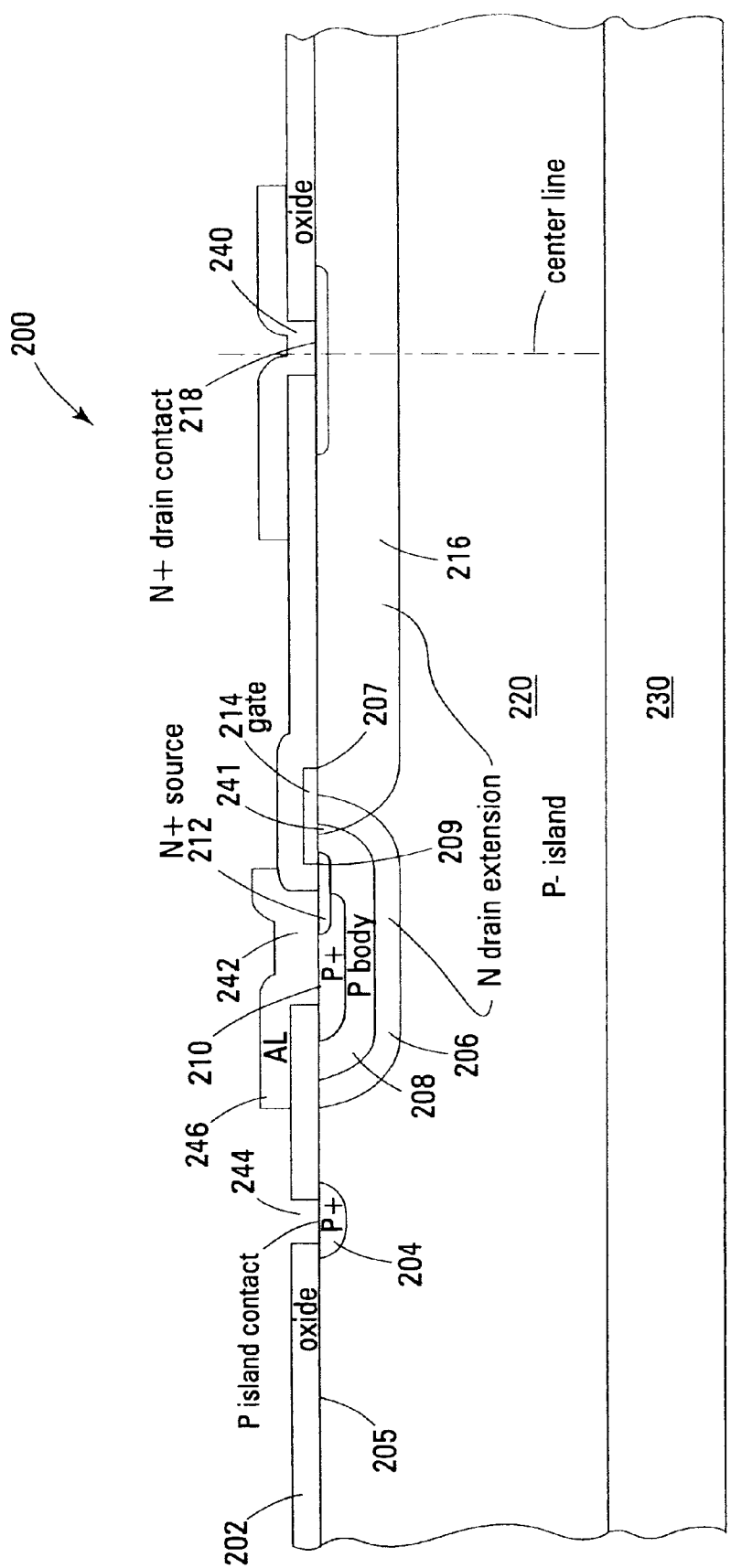
FIG. 2 is a cross-sectional view of one embodiment of a lateral MOS structure of the present invention.

Referring to FIG. 2 one embodiment of a lateral MOS structure 200 according to the present invention is illustrated. As illustrated, a P– island 220 is formed from a substrate 230 of an integrated circuit. The structure has a N+ source 212, a gate 214 and a N+ drain contact 218. Moreover, the structure 200 has a P+ area 210 and a P body 208. Unlike the prior art, this embodiment has a first N drain extension 216 and a second N drain extension 206. The first and second N drain extensions 216 and 206 extend from both sides of the gate 214. As a result of the addition of the second drain extension 206 on the source side, a region of increased doping is introduced in an area underneath the gate 214. More specifically, the additional dope and diffusing from the source side is added to the doping coming from the drain side of the structure 200. This increased doping reduces the linkage resistance and provides an improved ON resistance. In addition, as shown, the second drain extension 216 is positioned deeper in the P– island 220 than the P body 208 so that a portion of the second drain extension 216 provides added doping under the gate adjacent the surface intersection of the P-body 208.

In one embodiment, the concentration of P type conductive doping in the P body is higher than the concentration of N type conductive doping in the first drain extension 216. By doing this, an over lap potion 241, as illustrated in FIG. 2, of the P body 208 and the first drain extension 216 has a net P type doping. This ensures that a portion of the area under the gate 214 is not compensated to the opposite type. In another embodiment, an end of the second drain extension 206, that is adjacent the gate 214, is positioned so it is symmetrical to opposite side edges 207 and 209 of the gate 214.

As shown in FIG. 2, a top layer 202 is coupled to a top surface 205 of the P– island 220. The top layer 202, has a first aperture 240 that is aligned with the N+ drain contact 218 and a second aperture 242 that is partially aligned with the source 212. In addition, it is desired in the present invention, to connect the P- island 220 to the P-body 208. This allows for proper depletion of the first and second extension regions 216 and 206. More specifically, under reverse bias this design pushes the depletion level into the first and second extension regions 216 and 206 thereby helping to deplete them. Proper depletion of drain extension 110 of device 100 of FIG. 1 can achieved by placing the P-body 104 in direct contact with the P– island. However, as illustrated in FIG. 2, the second drain extension 206 wraps around the P– body 208 isolating the P-body 208 with the layer of the N-type material. To achieve proper depletion of the first and second drain extensions 216 and 206 in this embodiment, a P– island contact 204 is added to the structure 200. As illustrated, the top layer 202 has a third aperture 244 that is aligned with the P– island contact 204. In addition, interconnect portion 246 is used to connect the source 212 to the P– island 220 to help achieve proper depletion of the first and second drain extensions 216 and 206.

Figure 3:
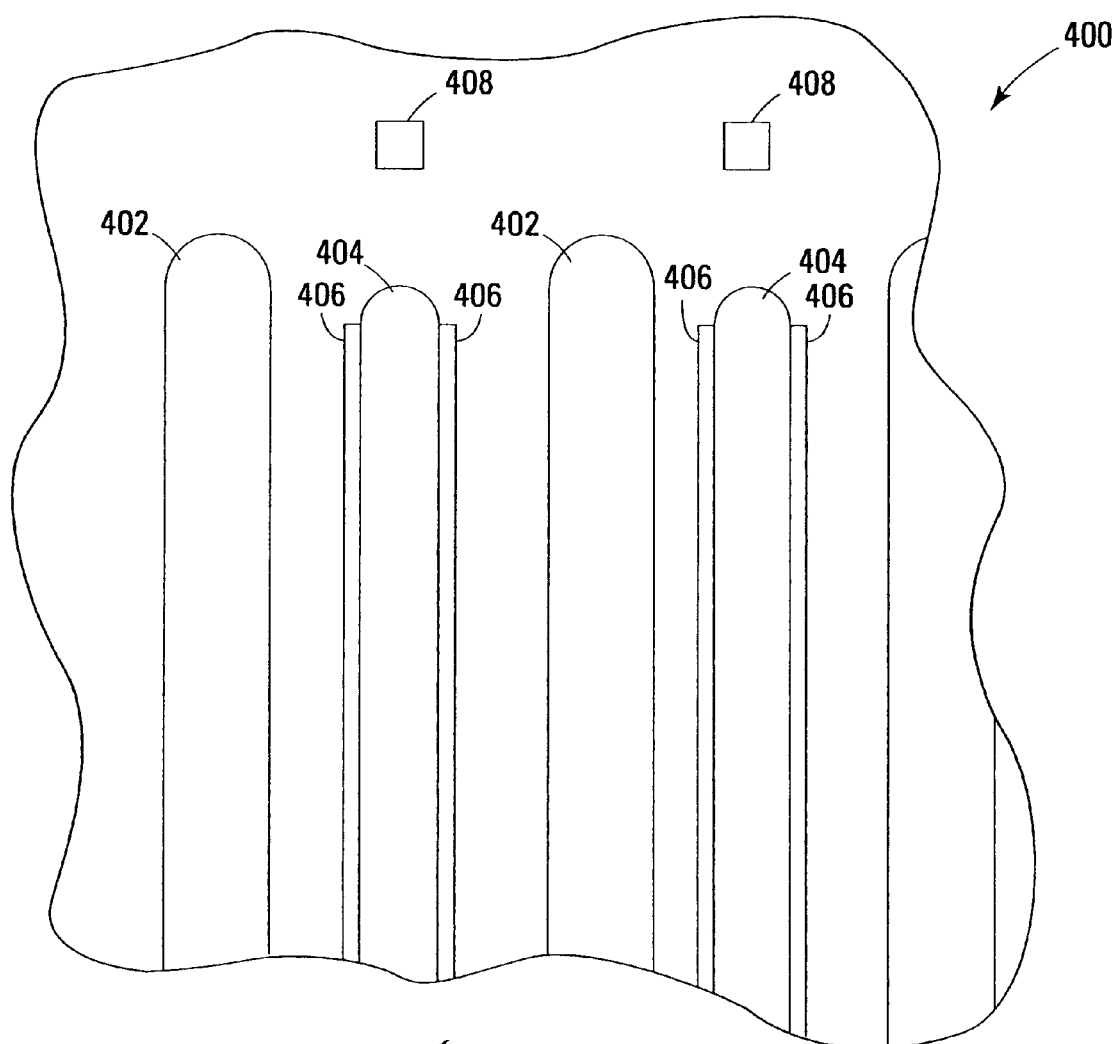
FIG. 3 is a plan view of a multi-cellular semiconductor device of one embodiment of the present invention.

In large multi-cellular integrated circuits using a plurality of MOS structures with dual drain extensions, the use of one P– island contact per structure is undesirable because it takes up too much space. Referring to FIG. 3, a plan view of a section of a large multi-cellular integrated circuit 400, as described above, is illustrated. As illustrated, the design typically has alternative drain 402 and source 404 strips terminating in generally half circles. The strips terminate generally in half circles to minimize concentrations of electrical fields at termination points. Gate strips 406 are positioned adjacent the source strips. In this embodiment, the P– island contacts 408 are positioned proximate the half circle termination points of the source strips 404 and are used by one or more DMOS devices. In particular, in this embodiment a longitudinal axis 405 of each source 404 is aligned with an axis 407 of an associated P– island contact 408. This is the preferred position to place a P– island contact 408 because it can be done without increasing the overall area of the integrated circuit 400. In one embodiment, the plurality of MOS structures are formed in a single island to create a single device constructed to achieve a desired voltage level. In another embodiment, a plurality of MOS structures are formed in a plurality of islands. The islands in this embodiment are isolated from each other thereby forming a plurality of devices on a single chip.

Figure 3A:
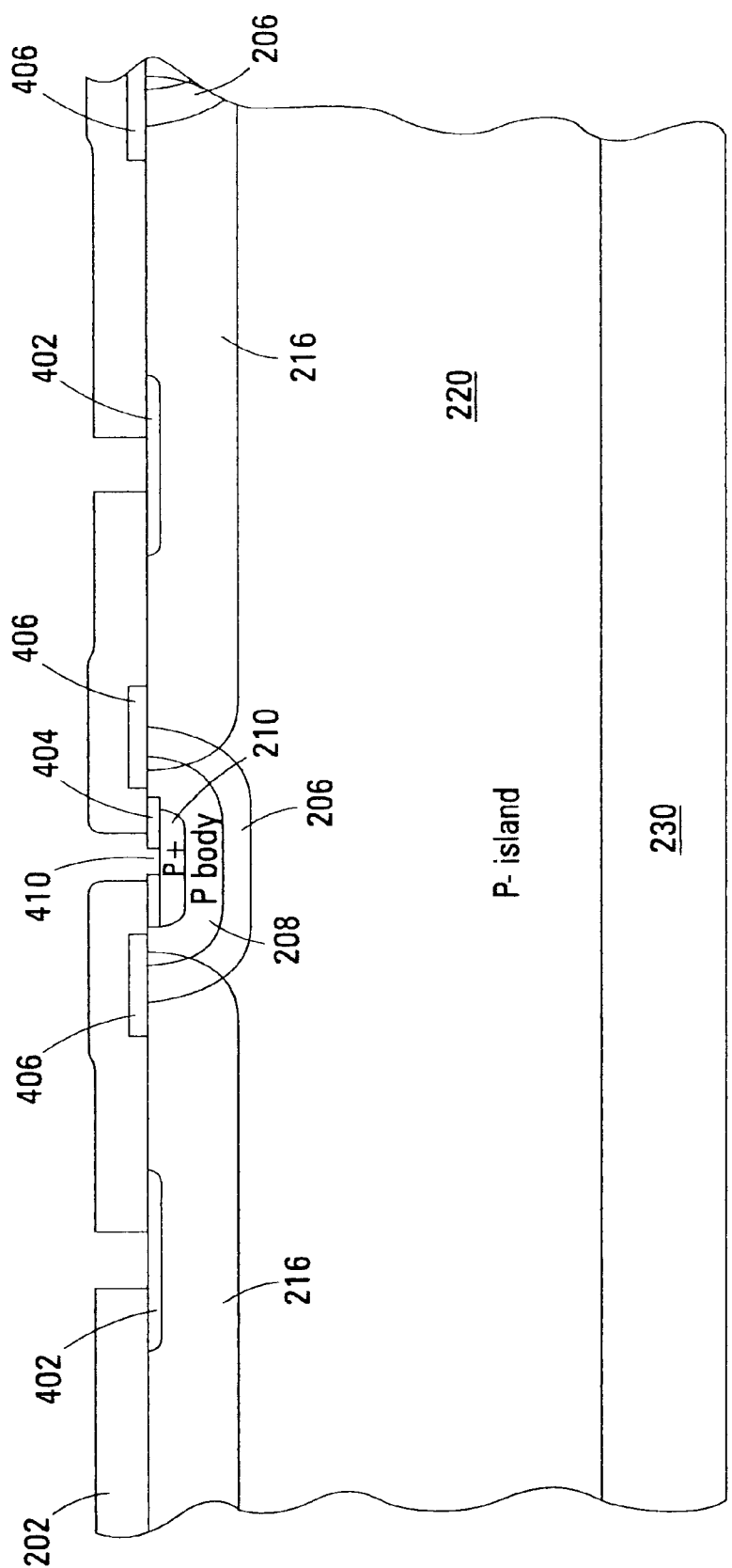
FIG. 3A is a cross sectional view of a multi-cellular semiconductor device of one embodiment of the present invention.

Referring to FIG. 3A a cross-sectional view of a section of the large multi-cellular integrated circuit 400 of one embodiment of the present invention is shown. As shown, the first drain extensions 216 are formed in the P− island 220 to extend laterally from a portion of an associated gate strip 406 past an associated drain contact 218 on a drain strip 402. The plurality of second drain extensions 206 are formed in the P− island 220 to extend laterally from a portion of an associated gate strip 406 around an associated source strip 404 to the top layer 202. In addition, the P body 208 in the large multi-cellular integrated circuit 400 is formed between the second drain extension 206 and the top layer 202. Moreover, the P+ area 210 is formed between the P body 208 and the top layer 202. A contact gap 410 is formed in the source strip 404 to provide a contact to the P+ area 210.

Figure 4C:
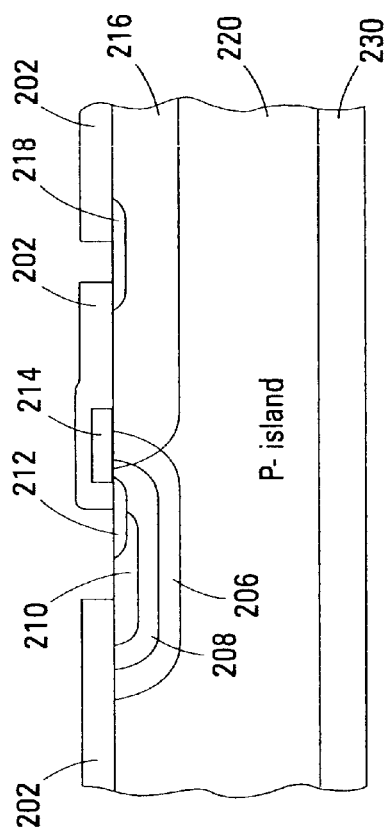
FIGS. 4a, 4b, and 4c are cross-sectional views that illustrate one embodiment for forming a lateral MOS structure of the present invention.
Figure 4A:
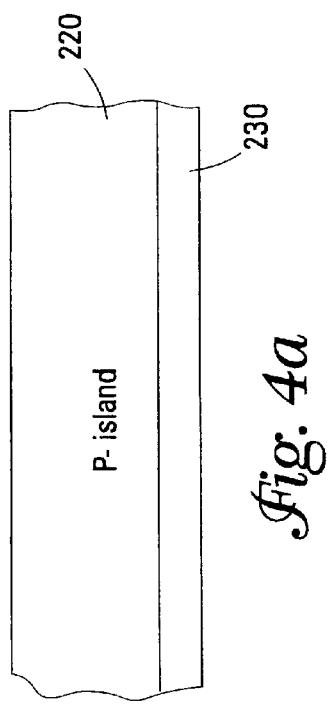
Figure 4B:
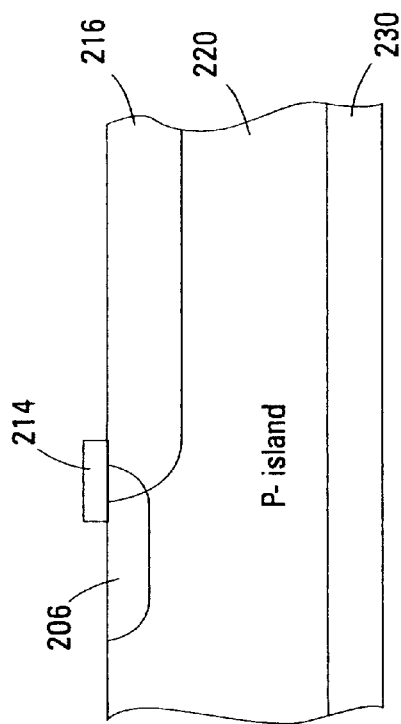

FIGS. 4a, 4b and 4c illustrate an embodiment for the formation of the lateral MOS structure 200. Referring to FIG. 4a, a portion of the substrate 230 is doped with a low acceptor density P conductivity type impurity or dopant to form the P− island 220. FIG. 4b illustrates the formation of the first drain extension 216 and the second drain extension 206 in the P− island 220. The first and second drain extensions 216 and 206 are formed by doping a portion of the P− island 220 with N conductivity type impurities. In one embodiment this is done with an ion implant. Moreover, the first and second drain extensions 206 and 216 are preferably doped by the same implant step then diffused resulting in matched doping profiles, equal junction depths and symmetrical under lap of the poly gate 214.

In one embodiment, gate 214 is formed by chemical vapor deposition polysilicon material. In one method of making the DMOS structure, the gate 214 is formed on the P− island 220 before the first and second drain extensions 216 and 206 are formed. This method allows the first and second drain extensions to be self aligned with the gate by using a gate poly as a mask during a doping introduction step. In another method, the first and second drain extensions 216 and 206 are formed before the gate 214 is formed. This method, however, may not be as desired as the previous method because it is difficult to get precise registration of the first and second drain extensions 216 and 206 without the gate 214 already in place. Although not shown, a thin gate dielectric or insulator, in the range of 200–1000 Å, is formed on the P-island 220 before the gate 214 is formed. The gate dielectric is positioned between the gate 214 and the P− island 220.

Referring to FIG. 4c, the P body 208 is formed by doping an area in the second drain extension 206 and an overlap portion of the first drain extension 216 with P conductivity type impurities. The P+ area 210 is formed by doping an area of the P body 208 with P conductivity type dopant having high density or high acceptor density. The source is formed by doping an area of the P+ body 210 and an area of the P body 208 with N conductivity type dopant having a high density or high donor density. The N+ contact 218 is formed by doping an area of the first drain extension 216 with N conductivity type dopant having a high donor density. In addition, the oxide 202 is formed, by, for example, deposition to the top surface 205 of the P− island 220 to protect the DMOS structure as well as other components on the integrated chip surface during testing, packaging and use.

Figure 5:
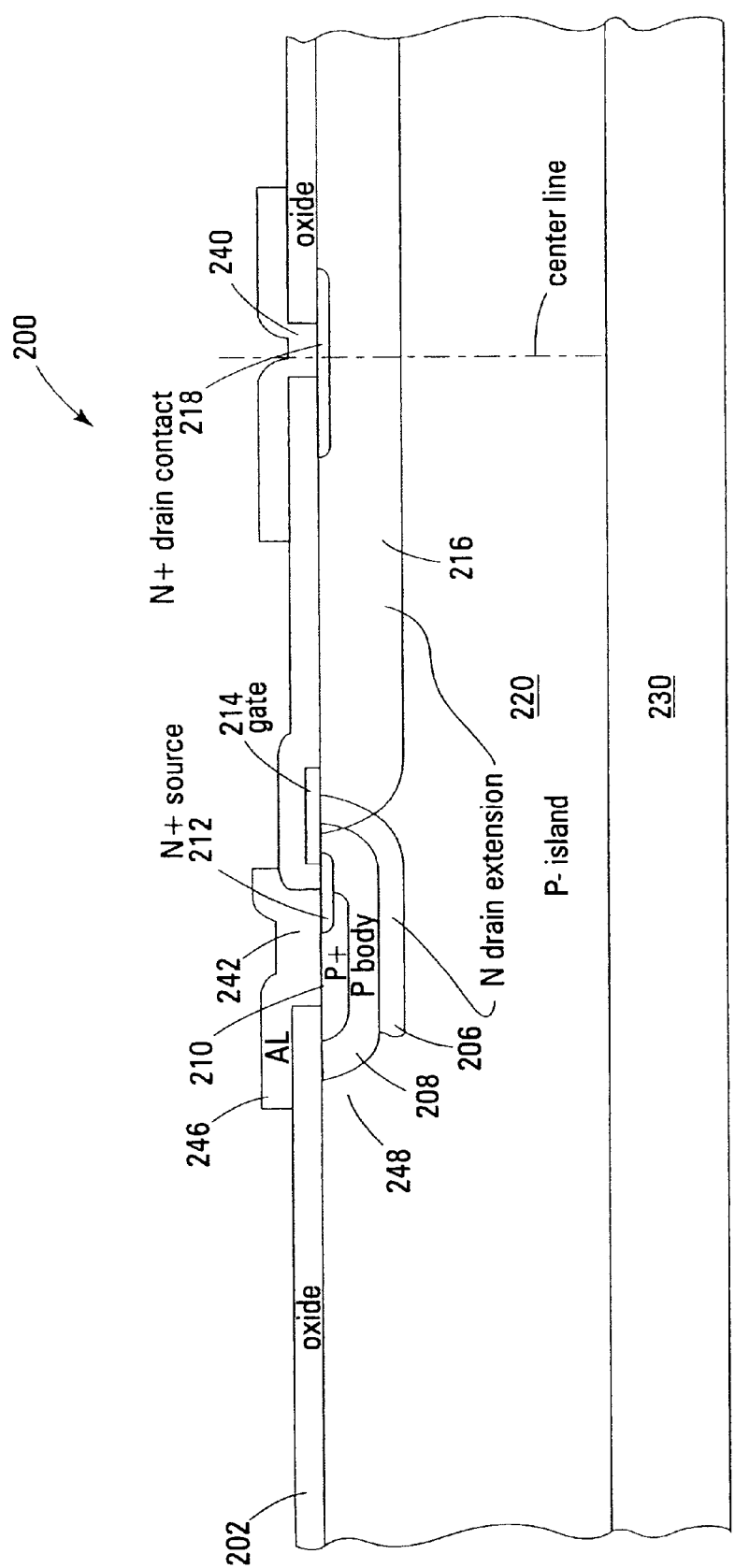
FIG. 5 is a cross-sectional view of another embodiment of a lateral MOS structure of the present invention.

In another embodiment, the second drain extension 206 is formed so it does not extend all the way around the P-body 208. That is, the second drain extension 206 may be masked so it does not wrap totally around the P body. This embodiment is illustrated in FIG. 5. As illustrated, the P− island 220 in this embodiment is in direct contact with the P body 208 through a gap 248 in the second drain extension 206. This embodiment maybe less desired, however, because it may be difficult to add the room needed to accommodate the gap 248 while still having the desired diffusion characteristics.

Figure 6:
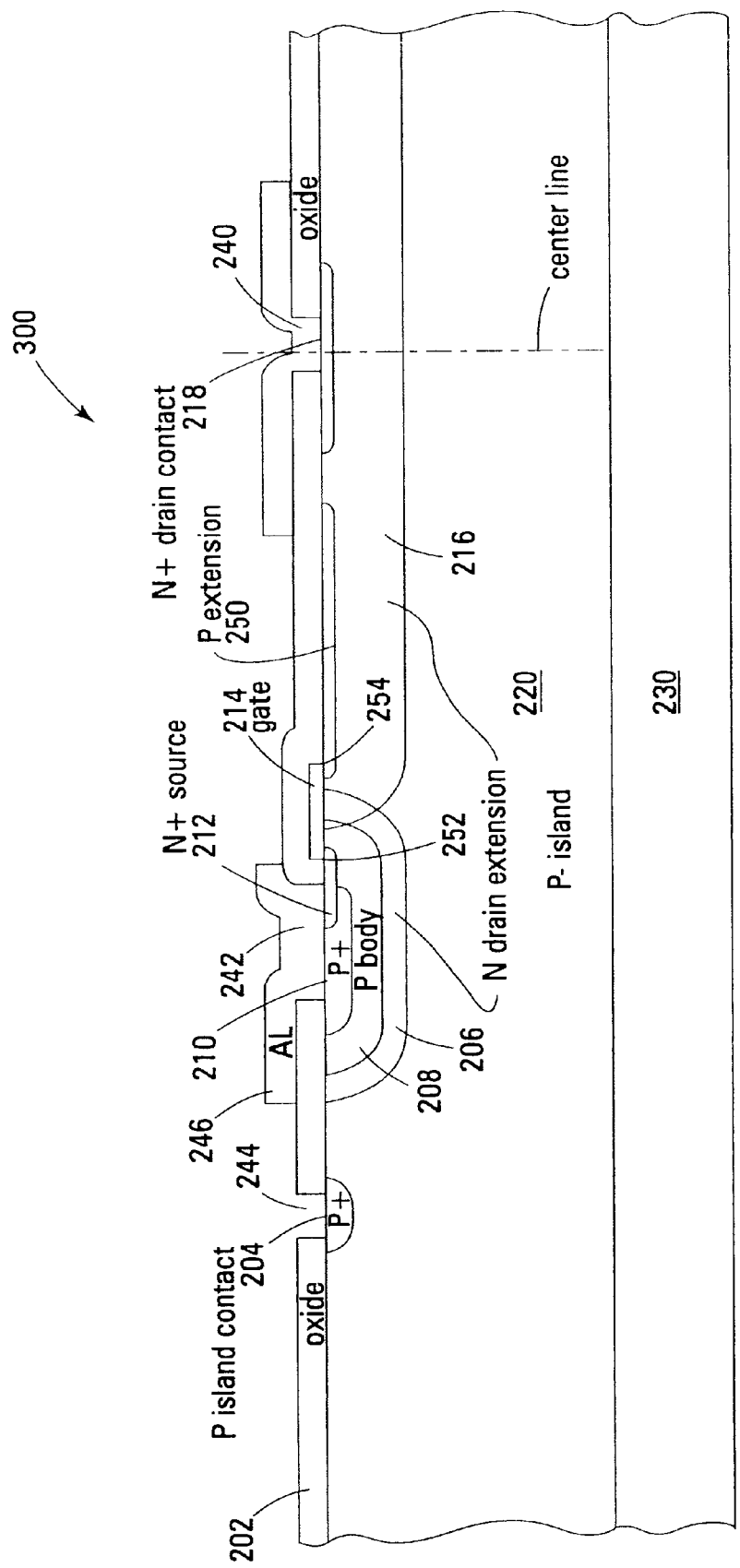
FIG. 6 is a cross sectional view of one embodiment of the present invention.

Referring to FIG. 6, another embodiment of the present invention is illustrated. In this embodiment, a P-extension 250 or third extension 250 is formed between the first drain extension 216 and the oxide layer 202 by doping an area of the first drain extension 216 with a P type impurity. In this embodiment, the P-extension 250 extends laterally from adjacent a portion of the gate 214 to proximate the drain contact 218. Moreover, in this embodiment, a lateral DMOS structure 300 having a breakdown voltage of approximately 400V will see approximately 4% improvement in ON resistance over a similar lateral DMOS structure having only a first drain extension 216 but not a second drain extension. In addition, the breakdown voltage of this embodiment will be approximately the same as the breakdown voltage of the similar lateral DMOS structure having only the first drain extension. Moreover, in one embodiment, the ends of the first and second drain extensions 216 and 206 that are adjacent the gate 214 are positioned so they are symmetrical to opposite side edges 252 and 254 of the gate 214.

Embodiments of the present invention introduce additional doping to make a useful improvement in the ON resistance of MOS devices without degrading the breakdown voltage. In addition, the process of adding an additional drain extension does not add additional steps to the manufacture of the device, since the additional drain extension can be formed at the same time the first drain extension is formed. Moreover, although embodiments of the present invention have been described as using N and P type semiconductor material in specific locations, it will be understood in the art that the N and P type semiconductor areas may be interchanged without departing from the spirit of the present invention and the present invention is not limited to the specific embodiments shown and described herein.

In addition, the P− island of the above described embodiments, may be formed with bonded wafers as is common in the art. Another method that could be used to form the P− island is by depositing an epitaxial layer on the top of a wafer. In addition there are other methods that will be recognized in the art for forming the P+ island and the present invention is not limited to the bonded wafer method or the epitaxial layer method.

Figure 7:
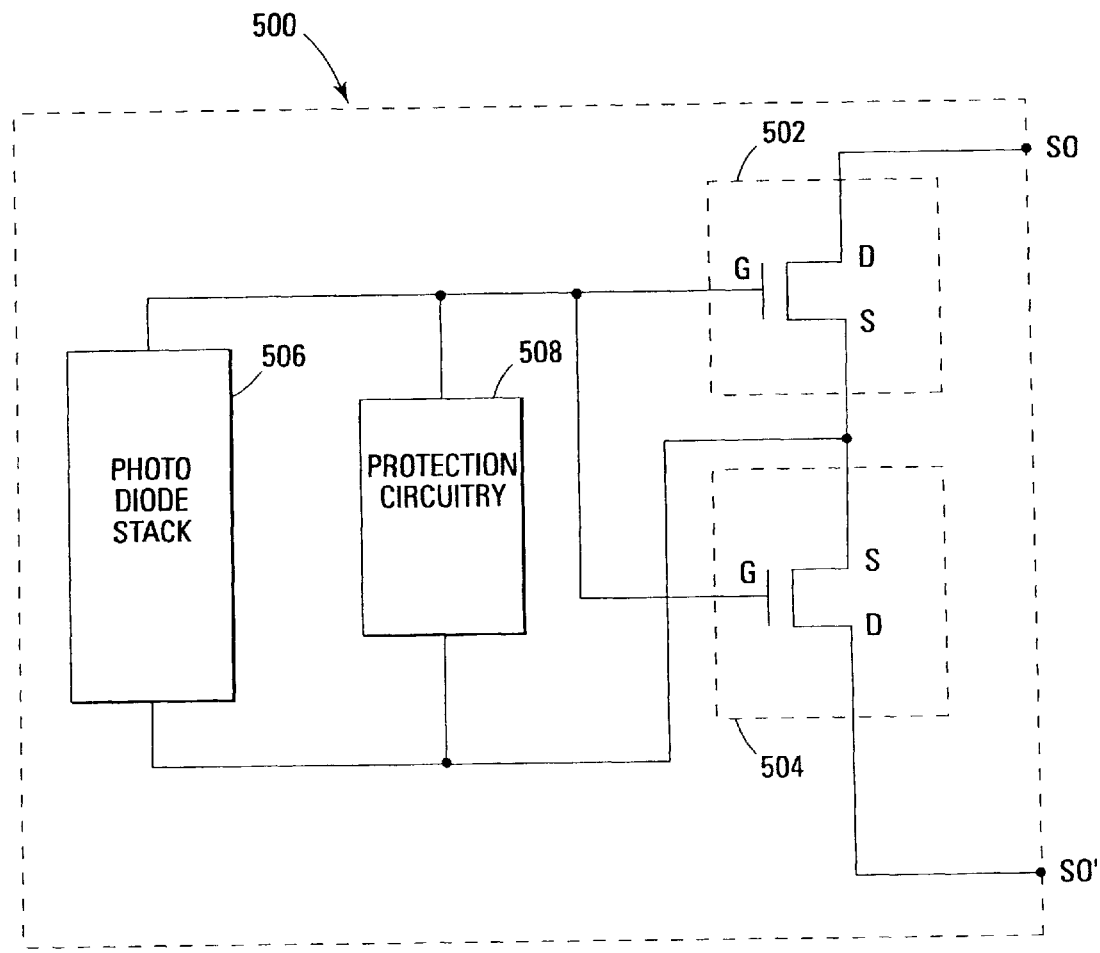
FIG. 7 is a block diagram of a solid state relay device of the present invention.

An embodiment of a solid state relay circuit 500 using a pair of reduced ON resistance DMOS devices 502 and 504 as described above, is illustrated in FIG. 7. As illustrated, the solid state relay circuit 500 includes a photo diode stack 506, a turn off and gate protection circuit 508 and two reduced ON resistance DMOS devices 502 and 504 in an integrated circuit. The photo diode stack 506 is used to drive voltage to the source S and gate G of each DMOS 502 and 504. Generally, the photo diode stack 506 is illuminated by a light emitting diode (not shown). The turn off and gate protection circuit 508 is coupled in parallel with the photo diode stack 506 to discharge any gate-source capacitance when the photo diode is not driving voltage to the source S and gate G of each DMOS 502 and 504. As illustrated, drain D of reduced ON resistance DMOS 502 is coupled to switch terminal S0. Moreover, drain D of reduced ON resistance DMOS 504 is coupled to switch terminal S0'.

Photo diodes in the photo diode stack 506 have open circuit voltage and a short circuit current when illuminated. A set of N photo diodes are connected in series to form the photo diode stack 506. An output stack open circuit voltage of the diode stack will be N times the open circuit voltage of a single photo diode. Moreover, the short circuit current of the photo diode stack 506 is equal to that of a single photo diode. Typically, an open circuit voltage of approximately 0.4V and a short circuit current of approximately 100 nA is produced by the solid state relay 500. A load comprising the gate capacitances of the two DMOS devices 502 and 504 is coupled to the photo diode stack 506 in the solid state relay 500. The gate capacitance is shunted by the turn off and gate protection circuitry 508 coupled in parallel with the photo diode stack 506. An equilibrium gate source voltage of the DMOS devices 502 and 504 in an off condition is 0V.

When the light emitting diode is turned on, illuminating the photo diode stack 506, the short circuit current of the photo diode stack 506 begins to charge the gate capacitance of DMOS devices 502 and 504. A gate-source voltage of each DMOS devices 502 and 504 rises as the respective gate capacitance charges until reaching the stack open circuit voltage. The number of photo diodes in the photo diode stack 506 is chosen such that its open circuit voltage is larger that the threshold voltages of the DMOS devices 502 and 504. Consequently, the DMOS devices 502 and 504 turn on when the stack is illuminated thereby presenting the ON resistance of the DMOS devices 502 and 504 in series with the switch terminals S0 and S0'.

DMOS device 502 and 504 are coupled in series to form a switch to block relatively large voltages, of both polarities, across the switch terminals S0 and S0' when the switch is off. This exploits the fact that the DMOS devices 502 and 504 each have asymmetric breakdown with the drain to source breakdown being relatively large while the source to drain breakdown is relatively small (often as small as a diode forward voltage). By having the DMOS devices 502 and 504 coupled in series, the drains D of the devices 502 and 504 are coupled to their associated switch terminals S0 and S0'. When switch terminal S0 has a positive voltage that is more positive than the voltage on switch terminal S0', the drain junction of the DMOS device 502 blocks the applied voltage. Moreover, when switch terminal S0' has a positive voltage that is more positive that the voltage on switch terminal S0, the drain junction of DMOS device 504 blocks the applied voltage.

Turn off of the solid state relay 500 is initialized when the LED is turned off. An output current of the photo diode stack 506 then goes to 0V. The turn off and gate protection circuit 508, which in its simplest form may comprise a relatively large resistor, discharges the gate capacitance of gate G of the DMOS devices 502 and 504 thereby taking the gate source voltage back to 0V on both DMOS devices 502 and 504.

The reduced ON resistance DMOS devices as described above can also be used for switching power supplies in integrated circuits. Yet another example in which the reduced ON resistance DMOS devices may be applied is in telecommunication switch integrated circuits. Moreover, any type of device that needs to integrate a high voltage switch could use the reduced ON resistance DMOS devices. Other applications include liner amplifier integrated circuits.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit having a high voltage lateral MOS, the high voltage lateral MOS comprising:
    a substrate;
    a top layer of dielectric, the top layer having a first aperture and a second aperture, wherein the first aperture is laterally spaced a predetermined distance from the second aperture;
    an island formed in the substrate doped with a low density of a first conductivity type, wherein the island is positioned between the top layer and the substrate;
    a drain contact formed in the island adjacent the first aperture in the top layer and doped with a high density of a second conductivity type;
    a source formed in the island adjacent the second aperture in the top layer and doped with a high density of a second conductivity type;
    a gate positioned under the top layer adjacent the island and between the source and the drain contact;
    a first drain extension of the second conductivity type formed in the island, the first drain extension is positioned adjacent the top layer extending laterally from under the gate to the drain contact; and
    a second drain extension of the second conductivity type formed in the island, the second drain extension is positioned adjacent the top layer extending laterally from under the gate to the source, wherein a portion of the second drain extension and a portion of the first drain extension overlap under the gate.

2. The integrated circuit having a high voltage lateral MOS of claim 1 wherein the overlapping first and second drain extensions create a region of increased doping of the second conductivity type under the gate.

3. The integrated circuit having a high voltage lateral MOS of claim 1 further comprising a third extension of the first conductive type formed in the second extension adjacent the top layer extending from under the gate to a position proximate the drain contact.

4. The integrated circuit having a high voltage lateral MOS of claim 3 wherein portions of the first and second drain extensions that are adjacent the gate are positioned approximately symmetrical to opposite side edges of the gate.

5. The integrated circuit having a high voltage lateral MOS of claim 1 further comprising:
    a body of the first conductive type formed between the second drain extension and the top layer.

6. The integrated circuit having a high voltage lateral MOS of claim 5 further comprising:
    a high density area of the first conductivity type formed between the body and the top layer, wherein a portion of the high density area of first conductivity type is adjacent a portion of the source.

7. The integrated circuit having a high voltage lateral MOS of claim 5 wherein the second drain extension extends beyond the body thereby isolating the body from the island.

8. The integrated circuit having a high voltage lateral MOS of claim 7 further comprising:
    an island contact having a high density of the first conductivity type formed in the island.

9. The integrated circuit having a high voltage lateral MOS of claim 8 wherein the island contact is coupled to the source.

10. An integrated circuit having a high voltage lateral DMOS, the high voltage lateral DMOS comprising:
- a substrate;
- a top layer of dielectric, the top layer having a first aperture and a second aperture, wherein the first aperture is laterally spaced a predetermined distance from the second aperture;
- a P– island formed in the substrate, wherein the P– island is positioned between the top layer and the substrate;
- a N+ drain contact formed in the P– island adjacent the first aperture of the top layer;
- a N+ source formed in the P– island adjacent the top layer, wherein at least a portion of the N+ source is positioned adjacent the second aperture of the top layer;
- a gate formed in the top layer adjacent the P– island, the gate is further positioned between the N+ source and the N+ drain contact;
- a N type first drain extension formed in the P– island, the first drain extension is positioned adjacent the top layer extending laterally from under the gate to the drain contact; and
- a N type second drain extension formed in the P– island, the second drain extension is positioned adjacent the top layer extending laterally from under the gate toward the N+ source, wherein a portion of the second drain extension overlaps the first drain extension under the gate.

11. The integrated circuit having a high voltage lateral DMOS of claim 10 wherein the N+ source extends laterally from a portion of the second aperture in the top layer to under a portion of the gate.

12. The integrated circuit having a high voltage lateral DMOS of claim 10 further comprising:
- a P-extension positioned between the first drain extension and the top layer extending laterally from a portion of the gate to a position proximate the N+ drain contact.

13. The integrated circuit having a high voltage lateral DMOS of claim 10 wherein the first drain extension is positioned around the drain contact.

14. The integrated circuit having a high voltage lateral DMOS of claim 10 wherein a portion of the second drain extension that is adjacent the gate is positioned approximately symmetrical to opposite side edges of the gate.

15. The integrated circuit having a high voltage lateral DMOS of claim 10 further comprising:
- a P body formed in the second drain extension, the P body extending laterally from under the gate past the N+ source; and
- a P+ area formed in the P– body, wherein the P+ area is positioned adjacent the first aperture in the top layer and a portion of the N+ source.

16. The integrated circuit having a high voltage lateral DMOS of claim 15 wherein the second drain extension has a gap therein, wherein the P– island is connected to the P body through the gap to achieve proper depletion of the first and second drain extensions.

17. The integrated circuit having a high voltage lateral DMOS of claim 15 wherein the P body overlaps a portion of the first drain extension.

18. The integrated circuit having a high voltage lateral DMOS of claim 17 wherein P type doping in the P body is higher than N type doping in the first drain extension so that in the overlap portion of the P body and the first drain extension there is a net P type doping.

19. The integrated circuit having a high voltage lateral DMOS of claim 15 wherein the second drain extension isolates the P body from the P– island.

20. The integrated circuit having a high voltage lateral DMOS of claim 19 further comprising:
- the top layer having a third aperture; and
- a P island contact formed in the P– island to achieve proper depletion of the first and second drain extensions, the P island contact is positioned adjacent a third aperture in the top layer.

21. The integrated circuit having a high voltage lateral DMOS of claim 20 further comprising:
- an interconnect portion to connect the source to the P– island to achieve proper depletion of the first and second drain extensions.

22. A solid state relay integrated circuit comprising:
- a photo diode stack to drive a voltage having a first output and a second output;
- a first high voltage DMOS having a gate, source and drain, the gate of the first high voltage DMOS is coupled to the first output of the photo diode stack, the source of the first high voltage DMOS is coupled to the second output;
- a second high voltage DMOS having a gate, source and drain, the gate of the second high voltage DMOS is coupled to the first output of the photo diode stack, the source of the second high voltage DMOS is coupled to the second output of the photo diode stack; and
- wherein the first and second high voltage DMOS comprise,
  - a top layer of dielectric, the top layer having a first aperture and a second aperture, wherein the first aperture is laterally spaced a predetermined distance from the second aperture,
  - an island formed in a substrate doped with a low density of a first conductivity type, wherein the island is positioned between the top layer and the substrate,
  - a drain contact formed in the island adjacent the first aperture in the top layer and doped with a high density of a second conductivity type,
  - a source formed in the island adjacent the second aperture in the top layer and doped with a high density of a second conductivity type,
  - a gate positioned under the top layer adjacent the island and between the source and the drain contact,
  - a first drain extension of the second conductivity type formed in the island, the first drain extension is positioned adjacent the top layer extending laterally from under the gate to the drain contact, and
  - a second drain extension of the second conductivity type formed in the island, the second drain extension is positioned adjacent the top layer extending laterally from under the gate to the source, wherein a portion of the second drain extension and a portion of the first drain extension overlap under the gate.

23. The solid state relay circuit of claim 22 further comprising:
- a turn off and gate protection circuit coupled in parallel with photo diode stack to discharge any gate source capacitance when the photo diode stack is not driving voltage to the first and second high voltage DMOS.

24. The solid state relay of claim 22 further comprising:
- a first switch terminal coupled to the drain of the first high voltage DMOS; and
- a second switch terminal coupled to the drain of the second high voltage DMOS.

* * * * *